United States Patent
Roth et al.

(10) Patent No.: US 10,651,359 B2
(45) Date of Patent: May 12, 2020

(54) ENERGY CONVERSION DEVICE FOR PROVIDING THERMAL AND ELECTRICAL ENERGY TO A GAS BURNER AND A GAS BURNER WITH AN ENERGY CONVERSION DEVICE AND A GAS COOKING FIELD

(71) Applicant: Miele & Cie. KG, Guetersloh (DE)

(72) Inventors: Bernhard Roth, Bielefeld (DE); Igor Bogdanoski, Enger (DE)

(73) Assignee: MIELE & CIE. KG, Guetersloh (DE)

( * ) Notice: Subject to any disclaimer, the term of this patent is extended or adjusted under 35 U.S.C. 154(b) by 332 days.

(21) Appl. No.: 15/677,047

(22) Filed: Aug. 15, 2017

(65) Prior Publication Data

US 2018/0053887 A1 Feb. 22, 2018

(30) Foreign Application Priority Data

Aug. 17, 2016 (DE) .................. 10 2016 115 280

(51) Int. Cl.
| | |
|---|---|
| *F24C 3/08* | (2006.01) |
| *F24C 3/10* | (2006.01) |
| *H01L 35/32* | (2006.01) |
| *F23N 1/02* | (2006.01) |
| *F23D 14/02* | (2006.01) |
| *H01L 35/14* | (2006.01) |
| *H01L 35/30* | (2006.01) |

(52) U.S. Cl.
CPC .............. *H01L 35/32* (2013.01); *F23D 14/02* (2013.01); *F23N 1/025* (2013.01); *F24C 3/08* (2013.01); *F24C 3/085* (2013.01); *F24C 3/103* (2013.01); *H01L 35/14* (2013.01); *H01L 35/30* (2013.01); *F23M 2900/13003* (2013.01)

(58) Field of Classification Search
CPC . F24C 3/08; F24C 3/103; H01L 35/32; H01L 35/30; H01L 35/14
USPC .. 126/39 R, 41 R, 39 BA, 39 E, 39 H, 39 N, 126/39 J, 39 K; 431/80
See application file for complete search history.

(56) References Cited

U.S. PATENT DOCUMENTS

| | | | |
|---|---|---|---|
| 7,166,796 B2 * | 1/2007 | Nicolaou | C04B 35/58085 136/201 |
| 2006/0172245 A1 | 8/2006 | Hu et al. | |
| 2010/0170551 A1 * | 7/2010 | Hiroyama | H01L 35/32 136/205 |
| 2014/0266002 A1 | 9/2014 | Nies et al. | |
| 2015/0107638 A1 * | 4/2015 | Takahashi | C08K 3/041 136/205 |

FOREIGN PATENT DOCUMENTS

| | | |
|---|---|---|
| CN | H 06129680 A | 5/1994 |
| CN | 102386813 A | 3/2012 |
| DE | 102012003471 A1 | 8/2013 |
| JP | H 07180842 A | 7/1995 |

* cited by examiner

*Primary Examiner* — Vivek K Shirsat
*Assistant Examiner* — Ko-Wei Lin
(74) *Attorney, Agent, or Firm* — Leydig, Voit & Mayer, Ltd.

(57) ABSTRACT

An energy conversion device to provide thermal energy and electric energy for a gas burner, comprising: an energy converter configured to provide thermal energy for a gas burner ring in which gas is burned, the energy converter having at least one thermoelectric element configured to convert a portion of the thermal energy into electric energy using a thermoelectric material.

20 Claims, 8 Drawing Sheets

ENERGY CONVERSION DEVICE FOR PROVIDING THERMAL AND ELECTRICAL ENERGY TO A GAS BURNER AND A GAS BURNER WITH AN ENERGY CONVERSION DEVICE AND A GAS COOKING FIELD

CROSS-REFERENCE TO PRIOR APPLICATION

Priority is claimed to German Patent Application No. DE 10 2016 115 280.3, filed on Aug. 17, 2016, the entire disclosure of which is hereby incorporated by reference herein.

FIELD

Energy conversion device to provide thermal energy and electric energy for a gas burner as well as a gas burner having an energy conversion device and a gas cooktop.

The approach presented here relates to an energy conversion device to provide thermal energy and electric energy for a gas burner, and it also relates as to a gas burner having an energy conversion device.

BACKGROUND

Thermoelectric generators convert heat or temperature differences into electric energy. This process is also reversible, see the Peltier effect. Application areas are to be found in industry wherever waste heat of machines and installations is converted, in motor vehicles for refrigeration units, possibly as a replacement for the generator, or in aerospace applications. In view of their current low efficiency, the use of thermoelectric generators is quite limited. Various materials for thermoelectric applications are disclosed in U.S. Pat. Appln. No. 2014/0266002 A1.

The approach presented here is based on the objective of creating an improved energy conversion device to provide thermal energy and electric energy for a gas burner as well as an improved gas burner having such an energy conversion device.

SUMMARY

In an embodiment, the present invention provides an energy conversion device for providing thermal energy and electric energy for a gas burner, comprising: an energy converter configured to provide thermal energy for a gas burner ring in which gas is burned, the energy converter having at least one thermoelectric element configured to convert a portion of the thermal energy into electric energy using a thermoelectric material.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
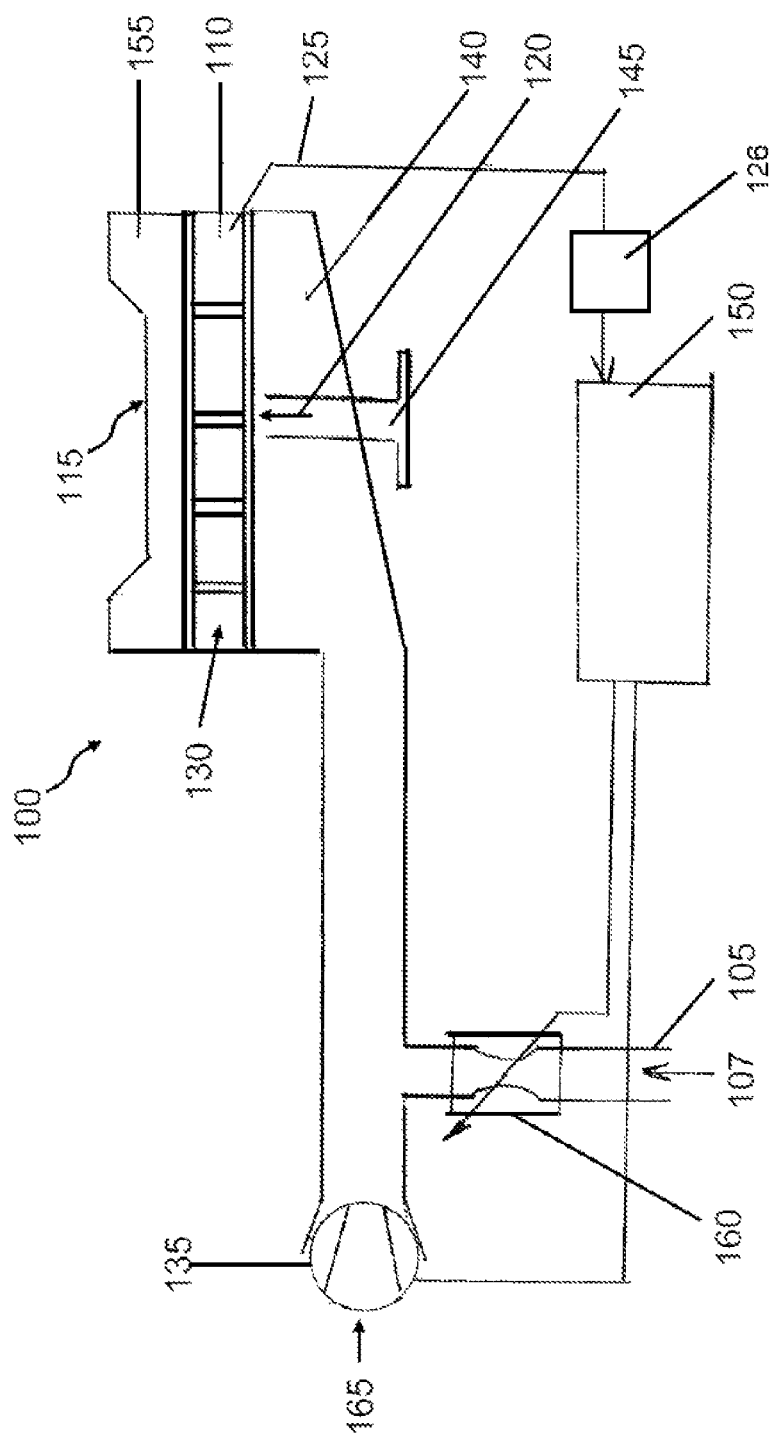
FIG. 1 a schematic cross section of a gas burner according to one embodiment.

In an embodiment, the present invention provides an energy conversion device is configured to provide thermal energy and electric energy for a gas burner, whereby the thermal energy is provided for a gas burner ring in that gas is burned. The energy conversion device has at least one thermoelectric element that is configured to convert a portion of the thermal energy into electric energy by using a thermoelectric material.

A thermoelectric element usually consists of a p-thermoelectric material, an n-thermoelectric material and a conductor situated between the p-thermoelectric material and the n-thermoelectric material. A gas burner can be, for example, an atmospheric burner or a forced-air gas burner.

The advantages that can be achieved with the approach presented here lie in the fact that, by providing electric energy, devices of the gas burner can be operated that, without the energy conversion device, would require an external power supply. Here, unutilized waste heat from the gas burner can serve to sensibly utilize energy in order to save power. Ideally, an entire gas stove or a gas cooktop can manage without an external power supply.

A gas stove or a gas cooktop has at least one gas burner ring. Normally, a gas stove or a gas cooktop has several gas burner rings. Each gas burner ring has at least one gas burner that burns a combustible gas in order to heat up pots and pans that have been placed on the gas burner ring.

The thermoelectric element can comprise a thermoelectric material that comprises, at least in part, magnesium silicide and/or polybutylene terephthalate and/or a half-Heusler alloy and/or skutterudite. These materials are suitable for converting thermal energy into electric energy, even at very high temperatures, for example, more than 200° C.

If the energy conversion device according to one embodiment has at least a first surface and a second surface as well as a support element that comprises thermoelectric material and that is arranged between the first surface and the second surface, then the energy conversion device can have two sides that are typical of thermoelectric generators, namely, a hot side and a cold side. The sides/surfaces serve as conductors here. The support element can be arranged in a cylindrical manner between the surfaces and can comprise a p-thermoelectric material or an n-thermoelectric material.

In order to be able to connect two thermoelectric elements to each other in series and thus in order to be able to provide a higher electric voltage, the energy conversion device can have at least a further first surface, a further second surface, an additional second surface, a further support element comprising thermoelectric material, an additional support element comprising thermoelectric material, and a supplementary support element comprising thermoelectric material. Here, the further first surface can be arranged opposite from the first surface and, together with the first surface, can essentially form a first circular-ring segment, and the further second surface and the additional second surface can be arranged opposite from the second surface and, together with the second surface, can essentially form a second circular-ring segment. The further support element can be arranged between the first surface and the additional second surface, the additional support element can be arranged between the further first surface and the second surface, and the supplementary support element can be arranged between the further first surface and the further second surface. A structure as described here can serve, for example, as a module of the energy conversion device, and the module, for example, in a multiple configuration, can form a circular ring having an even larger number of thermoelectric elements. If, for instance, twelve such modules together form the circular ring, the energy conversion device can have twenty-four thermoelectric elements that can be connected in series and that can thus provide a great deal of electric energy.

When the energy conversion device is in its operational state, the first surface and the further first surface can be arranged facing the gas burner ring, and the second surface, the further second surface and the additional second surface can be arranged facing a gas supply of the gas burner. When, as described above, the energy conversion device forms the circular ring, the latter can be arranged essentially parallel to the gas burner ring in the vicinity of a gas flame of the gas burner ring. In this context, the support element and the additional support element can be arranged, for instance, on a first radius of the circular ring, and the additional support element and the supplementary support element can be arranged on a second, smaller radius of the circular ring.

In order to protect the at least one thermoelectric element, a filler material can be arranged between the first circular-ring segment and the second circular-ring segment, whereby said filler material can advantageously have a lower thermal conductivity than the thermoelectric material.

According to one embodiment, the energy conversion device can have at least one passage opening that is configured in such a way that, when the energy conversion device is in its operational state, it allows air and/or gas to pass from a gas supply of the gas burner through the energy conversion device to the gas burner ring. Here, the passage opening can be arranged parallel to the support elements in the center of the support elements and it can connect an opening between the first surface and the further first surface, as well as a further opening between the second surface and the further second surface and the additional second surface, all the way through the filler material.

According to one embodiment, the at least one thermoelectric element can have an interface to provide the electric energy to the at least one electronic device of the gas burner. The interface can comprise, for example, at least an electrode and/or a cable so that it can conduct the converted electric energy to the electronic device. The electronic device can be configured as a regulator for an air-gas supply and/or as a control panel and/or as an electric igniter and/or as an electric gas metering device of the gas burner.

In order to be able to nevertheless provide air for a gas flame in the case of an atmospheric gas burner without a forced-air device, the energy conversion device can have at least one air supply conduit that can be arranged between two of the thermoelectric elements. In order to be able to supply a large quantity of air, the energy conversion device can advantageously have such air supply conduits between all of the modules and these air supply conduits can extend from outside of the energy conversion device so as to open up into the center of the circular ring.

The energy conversion device can also have a base disc and/or a cover disc, whereby the base disc can be arranged on the bottom of the energy conversion device facing the gas supply of the gas burner when the energy conversion device is in its operational state, and the cover disc can be arranged on the top of the energy conversion device facing the gas burner ring when the energy conversion device is in its operational state. The base disc and/or the cover disc can advantageously be made at least partially of steel, whereby the base disc and the cover disc can be screwed together in order to stabilize the energy conversion device.

A gas burner has at least one of the presented energy conversion devices, which is arranged between the gas supply of the gas burner and the gas burner ring. A gas burner presented here can serve as a replacement for conventional gas burners, whereby the presented gas burner advantageously attains the above-mentioned advantages of the energy conversion device.

The gas burner can have an energy storage device to store electric energy that has been converted by the energy conversion device. Consequently, energy can be available to the gas burner already before it is ignited, for example, already in order to electrically ignite the gas flame.

If the gas burner has at least one of the described electronic devices and if the energy conversion device is configured to supply the at least one electronic device with electric energy, then according to one embodiment, the gas burner can manage without an external power supply for the at least one electronic device.

FIG. 1 shows a schematic cross section of a gas burner 100 according to one embodiment.

The gas burner 100 has at least one gas supply 105 and an energy conversion device, or energy converter, 110. The gas supply 105 is configured to supply gas 107 to the gas burner 100. The energy conversion device 110 is arranged between the gas supply 105 and a gas burner ring 115 of a gas stove or gas cooktop.

The energy conversion device 110 is configured to provide thermal energy 120 and electric energy 125 for the gas burner 100, whereby thermal energy 120 is provided for the gas burner ring 115 in that the gas 107 is burned. The energy conversion device 110 has at least one thermoelectric element 130 that is configured to convert a portion of the thermal energy 120 into electric energy 125.

Optionally, the gas burner 100 according to this embodiment has a blower 135, a premixing device 140, a combustion device 145, an electronic device 150, a burner cover 155 and a valve 160, for example, a solenoid valve. The blower 135 is configured to provide air 165 for the gas burner 100 which, according to this embodiment, is configured as a forced-air gas burner. According to an alternative embodiment, the gas burner 100 can also be configured as an atmospheric burner that does not have a blower 135. Before the combustion, the air 165 and the gas 107 are mixed in the premixing device 140. For this purpose, the premixing device 140 according to this embodiment has an aluminum goblet and a mixing tube. The combustion device 145 is configured to burn the air-gas mixture in order to provide the thermal energy 120. The electronic device 150 can comprise a regulator for an air-gas supply and/or a control panel and/or an electric igniter and/or an electric gas metering device. According to this embodiment, the energy conversion device 110 is configured to supply the electronic device 150 with the electric energy 125.

According to one embodiment, the gas burner 100 can have an energy storage device 126 that is configured to store electric energy 125 that has been provided by the energy conversion device 110. For example, the energy conversion device is configured as a capacitor or as an accumulator.

Below, embodiments will be described once again in greater detail with reference to FIG. 1: if conventional atmospheric burner systems in gas cooktops are replaced or augmented by forced-air gas burners such as the gas burner 100 presented here, a thermoelectric generator in the form of the energy conversion device 110—which is integrated into the forced-air gas burner and which uses the waste heat of the latter for the electric energy conversion—can deliver the requisite electric energy 125 to optimally regulate the gas and air supply.

An important aspect here is the energy recovery involving thermoelectronics in the form of at least one thermoelectric element 130. In contrast to thermoelectric generators—called TEGs for short—with, for instance, bismuth telluride, the energy conversion device 110 presented here can ensure a uniform efficiency of the thermoelectric material, even at high side temperatures of more than 200° C., and it can withstand the operating temperature of the requisite solder. Ready-made modules of the energy conversion device 110 can likewise be used since their dimensions and shapes—unlike the familiar TEGs—can be adapted. The focus is on the selection of the thermoelectric alloy in the form of the thermoelectric material and on the electric connection of the thermoelectric elements 130 as well as on a suitable covering and on the thermal output adaptation. Possible thermoelectric connections, in other words, thermoelectric materials for the thermoelectric element 130, include magnesium silicide—$Mg_2Si$ for short—polybutylene terephthalates—PBTs for short—half-Heusler alloys (half-Heuslers) and/or skutterudites. All of the electric connection techniques are based on the use of suitable solders. They are suitable for the materials and temperatures in question.

Thermoelectric elements 130 or generators could also be used in cooktops 115 with conventional atmospheric burners. The generated electric energy 125 can then be used to operate, for example, the electronic controls, for instance, a touch display, the electric igniter and/or the electric gas metering device, for instance, a shut-off valve. In the case of forced-air gas burners, the operation of the fan or the blower 135 is also necessary during the ignition of the gas burner 100. Since thermoelectric elements 130 only deliver electric energy 125 once the gas burner 100 is emitting heat, it is advantageous for the cooktop 115 or for the gas burner 100 to have a storage device for the electric energy 125.

Advantageously, when the energy conversion device 110 is used to ignite the gas burner 100, there is no longer a need for an electric connection or for an electric mains connection. The energy conversion device 110 permits high heating outputs for compact forced-air gas burners, whereby the burner efficiency is increased by an optimal air and gas supply, thereby lowering the gas consumption of the gas burner 100.

Figure 2:
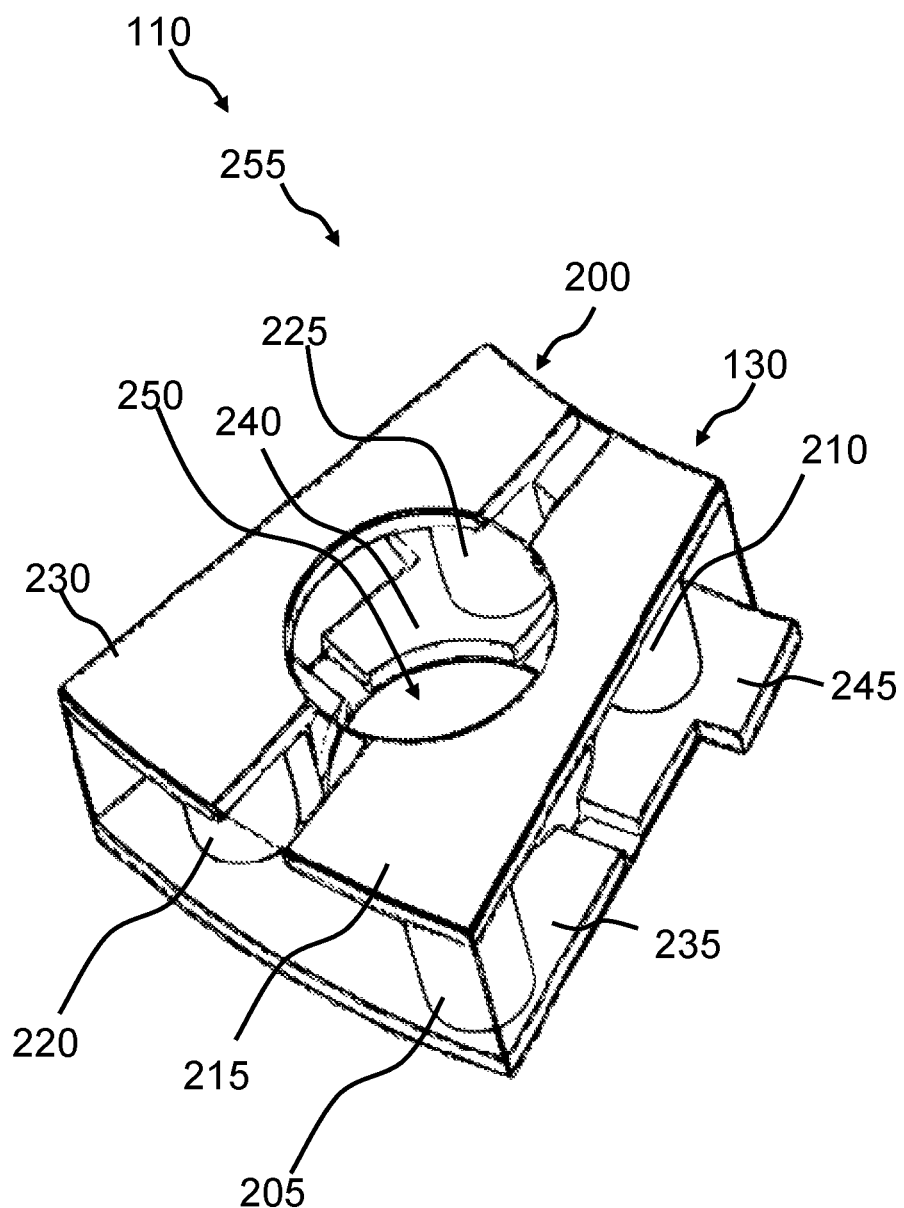
FIG. 2 a perspective top view of an energy conversion device according to one embodiment.

FIG. 2 shows a perspective top view of an energy conversion device 110 according to one embodiment. This can be the energy conversion device 110 described with reference to FIG. 1.

According to this embodiment, the energy conversion device 110 not only has the thermoelectric element 130, which can also be referred to as a thermocrystal, but also a further thermoelectric element 200. According to an alternative embodiment, however, the energy conversion device 110 can also consist exclusively of the one thermoelectric element 130. According to this embodiment, the thermoelectric element 130 comprises a first support element 205, a further support element 210 and a first surface 215 that connects the first support element 205 to the further support element 210. According to this embodiment, the first support element 205 comprises a p-thermoelectric magnesium silicide as the thermoelectric material, and the further support element comprises an n-thermoelectric magnesium silicide as the thermoelectric material, whereby the first surface 215 is configured so as to be conductive.

The optional further thermoelectric element 200 consists of an additional support element 220, a supplementary support element 225 and a further first surface 230 that connects the additional support element 220 to the supplementary support element 225. According to this embodiment, the additional support element 220 has an n-thermoelectric magnesium silicide as the thermoelectric material, and the supplementary support element 225 has a p-thermoelectric magnesium silicide as the thermoelectric material, whereby the further first surface 230 is configured so as to be conductive.

According to an alternative embodiment, additionally or as an alternative, the support elements 205, 210, 220, 225 can also comprise polybutylene terephthalate and/or a half-Heusler alloy and/or skutterudite as the thermoelectric material.

According to this embodiment, the further first surface 230 is arranged opposite from the first surface 215 and, together with the first surface 215, it forms a first circular-ring segment, whereby the first surface 215 and the further first surface 230 do not touch each other.

According to this embodiment, the energy conversion device 110 has a second surface 235, a further second surface 240 and an additional second surface 245, whereby the further second surface 240 and the additional second surface 245 are arranged opposite from the second surface 235 and, together with the second surface 235, they form a second circular-ring segment, whereby the second surface 235, the further second surface 240 and the additional second surface 245 do not touch each other. The second circular-ring segment is arranged on ends of the support elements 205, 210, 220, 225 opposite from the first circular-ring segment, whereby the support element 205 is arranged between the first surface 215 and the second surface 235, the further support element 210 is arranged between the first surface 215 and the additional second surface 245, the additional support element 220 is arranged between the further first surface 230 and the second surface 235, and the supplementary support element 225 is arranged between the further first surface 230 and the further second surface 240.

According to this embodiment, the first surface 215 and the further first surface 230 are arranged facing the gas burner ring when the energy conversion device 110 is in its operational state, and the second surface 235, the further second surface 240 and the additional second surface 245 are arranged facing the gas supply of the gas burner.

According to this embodiment, the energy conversion device 110 has one passage opening 250 that extends all the way through the energy conversion device 110 parallel to the support elements 205, 210, 220, 225 in the center of the support elements 205, 210, 220, 225.

The passage opening 250 is configured to allow air and/or gas to pass from a gas supply of the gas burner through the energy conversion device 110 to the gas burner ring.

According to this embodiment, the support element 205 and the additional support element 220 are arranged on a first radius of the circular ring, and the additional support element 210 and the supplementary support element 225 are arranged on a second, smaller radius of the circular ring.

Figure 5:
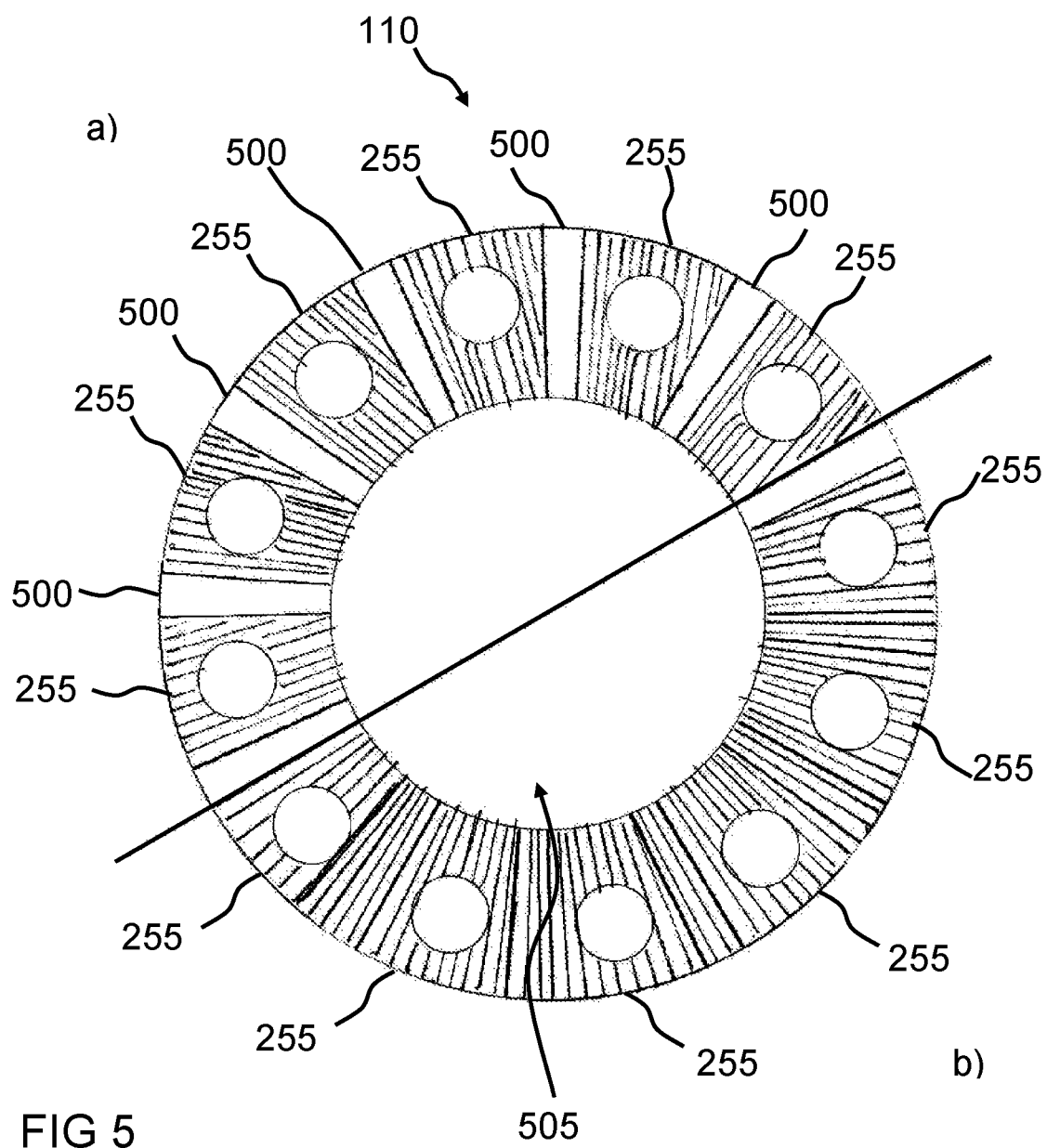
FIG. 5 a schematic top view of an energy conversion device according to one embodiment.

A structure of the energy conversion device 110 as described here can serve, for example, as a module 255 of a larger energy conversion device, whereby the module 255, for example, in a multiple configuration, can form a circular ring—shown starting with FIG. 5—that has a considerably larger number of thermoelectric elements, which can be connected in series.

Figure 3:
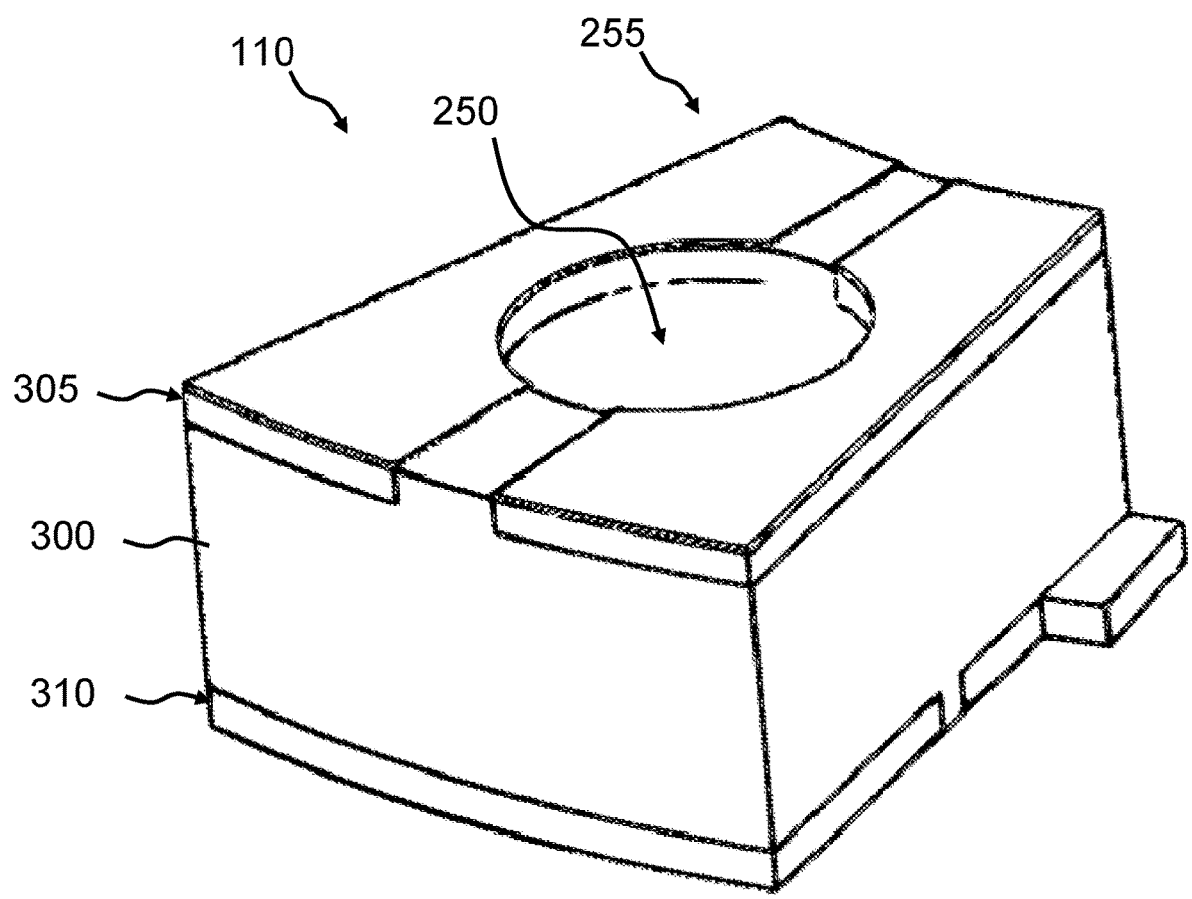
FIG. 3 a perspective side view of an energy conversion device according to one embodiment.

FIG. 3 shows a perspective side view of an energy conversion device 110 according to one embodiment. This can be the module 255 described with reference to FIG. 2, but with the difference that the energy conversion device 110 according to this embodiment has a filler material 300. The filler material 300 is arranged between the first circular-ring segment 305 and the second circular-ring segment 310, and it has a lower thermal conductivity than the thermoelectric material of the support elements. According to this embodiment, the passage opening 250 also passes all the way through the filler material 300.

In other words, FIG. 3 shows a sub-module with filler material 300 that serves to encapsulate or protect the thermoelectric elements and to convey the air-gas mixture through the passage opening 250.

Figure 4:
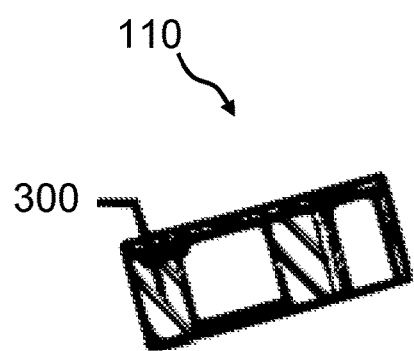
FIG. 4 a side cross section of an energy conversion device according to one embodiment.

FIG. 4 shows a side cross section of an energy conversion device 110 according to one embodiment. This can be the energy conversion device 110 described with reference to FIG. 3.

FIG. 5 shows a schematic top view of an energy conversion device 110 according to one embodiment. This can be an energy conversion device 110 that has a plurality of the modules 255 described in FIG. 3 or 4. According to this embodiment, the energy conversion device 110 has twelve of the modules 255, which are arranged in a circle to form a circular ring and are electrically connected in series. Such a configuration of the energy conversion device 110 can also be referred to as a burner ring with thermoelectric elements. In section a) of FIG. 5, a variant with air supply conduits 500 between the modules 255 is contrasted with another variant without air supply conduits 500 in section b) of FIG. 5. The air supply conduits 500 in section a) are arranged between the modules 255 and, in the case of an atmospheric internal circle burner without a blower 135, they are configured to convey air from outside of the energy conversion device 110 into the circle center 505 of the energy conversion device 110, which is configured as a circular ring.

Cross-hatched surface areas shown in FIG. 5 are fitted with thermoelectric elements.

Figure 6:
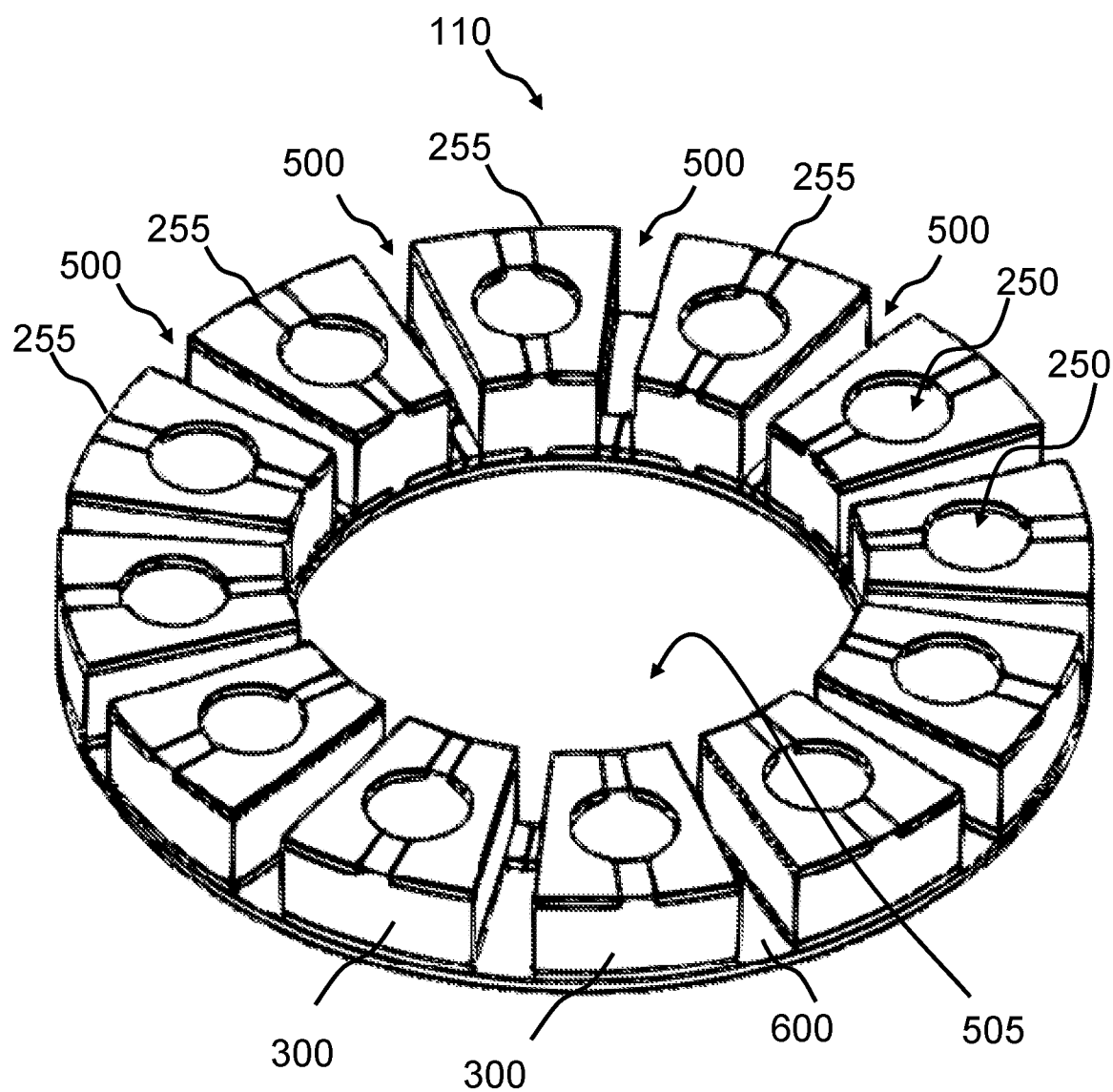
FIG. 6 a perspective top view of an energy conversion device according to one embodiment.

FIG. 6 shows a perspective top view of an energy conversion device 110 according to one embodiment. This can be the energy conversion device 110 with air supply conduits 500 described with reference to FIG. 5 under a). This embodiment with the air supply conduits 500 is suited for atmospheric gas burners without the blower that serves to supply air, as shown in FIG. 1. According to this embodiment, the energy conversion device 110 has one air conduit 500 between each of the modules 255 and thus a total of twelve air conduits 500.

According to this embodiment, the energy conversion device 110 also has a base disc 600 that is arranged on the bottom of the energy conversion device 110 facing the gas supply of the gas burner when the energy conversion device 110 is in its operational state. According to this embodiment, the base disc 600 is made of steel and it is configured to stabilize the modules of the energy conversion device 110.

According to an alternative embodiment, as an alternative or in addition, the energy conversion device 110 can have a cover disc that is arranged on the top of the energy conversion device 110 facing the gas burner ring when the energy conversion device 110 is in its operational state. The base disc 600 and/or the cover disc can be soldered onto the modules and can be screwed together.

In other words, FIG. 6 shows a dimensional diagram of the energy conversion device 110. Electrodes serve to tap the voltage for testing and measuring purposes. According to this embodiment, the filler material 300 also serves as a holder in order to utilize the full twelve passage openings 250 to convey the air-gas mixture. The energy conversion device 110 takes up the largest possible heat output when its thermal transfer resistance corresponds to the sum of the thermal transfer resistances between the heat source and the surroundings, in other words, when there is an output adaptation. The dimension of the thermoelectric elements is selected accordingly. The thickness of the base disc 600 or the thickness of the steel disc is chosen as a compromise between stability and thermal capacity.

Dimensions by way of an example for the energy conversion device 110 are a height of 11.4 mm for the energy conversion device 110 together with the base plate 600, an outer diameter of 95.6 mm for the energy conversion device 110, a diameter of 10 mm for the passage openings 250, a diameter of 54 mm for the circle center 505, and a height of 1.17 mm for the base plate 600.

Figure 7:
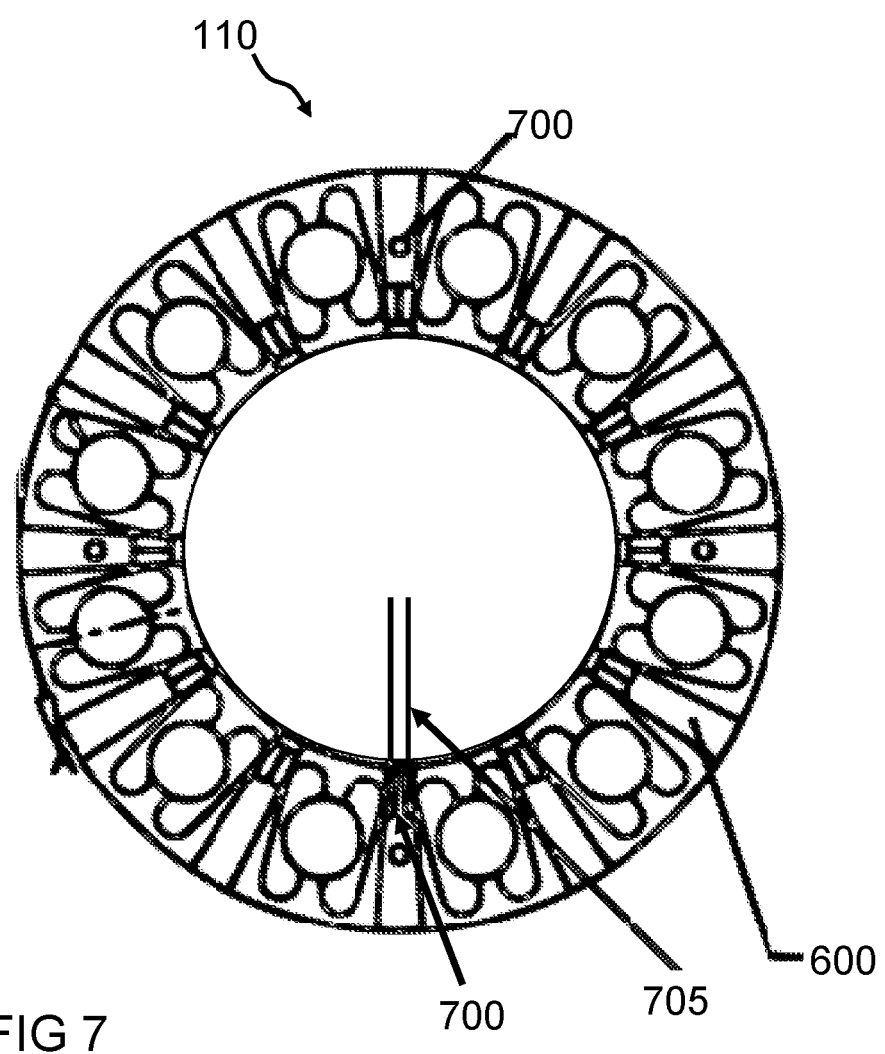
FIG. 7 a schematic top view of an energy conversion device according to one embodiment.

FIG. 7 shows a schematic top view of an energy conversion device 110 according to one embodiment. This can be the energy conversion device 110 described with reference to FIG. 6. According to this embodiment, the base plate 600 has four threaded holes 700 that serve to screw the base plate 600 to the cover plate. According to this embodiment, one of the thermoelectric elements has an interface 700 to provide the electric energy for the electronic device of the gas burner. The interface 700 is connected to a cable 705 to conduct the electric energy to the electronic device of the gas burner.

Figure 8:
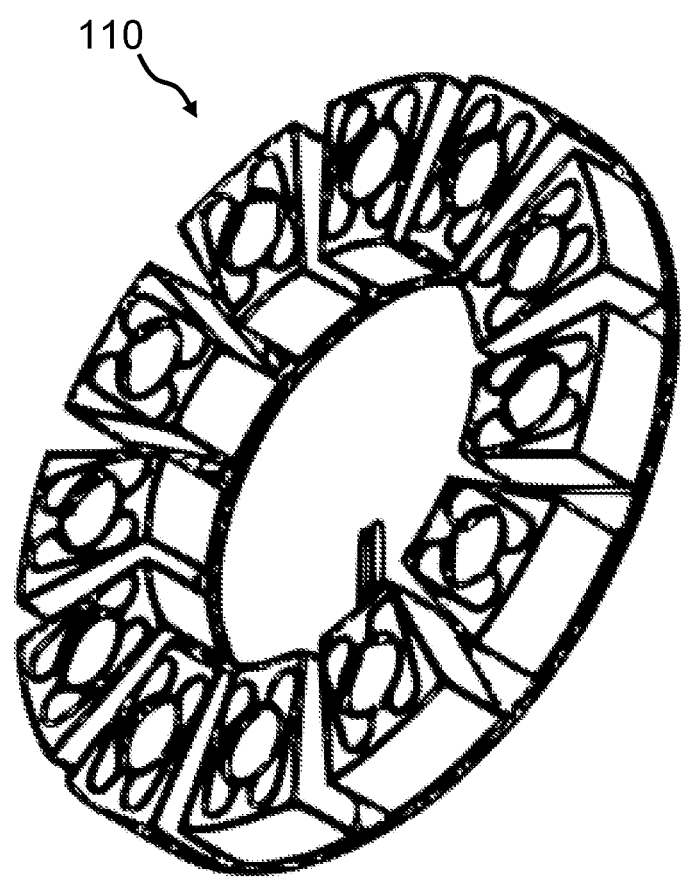
FIG. 8 a perspective side view of an energy conversion device according to one embodiment.

FIG. 8 shows a perspective side view of an energy conversion device 110 according to one embodiment. This can be the energy conversion device 110 described with reference to FIG. 7.

Figure 9:
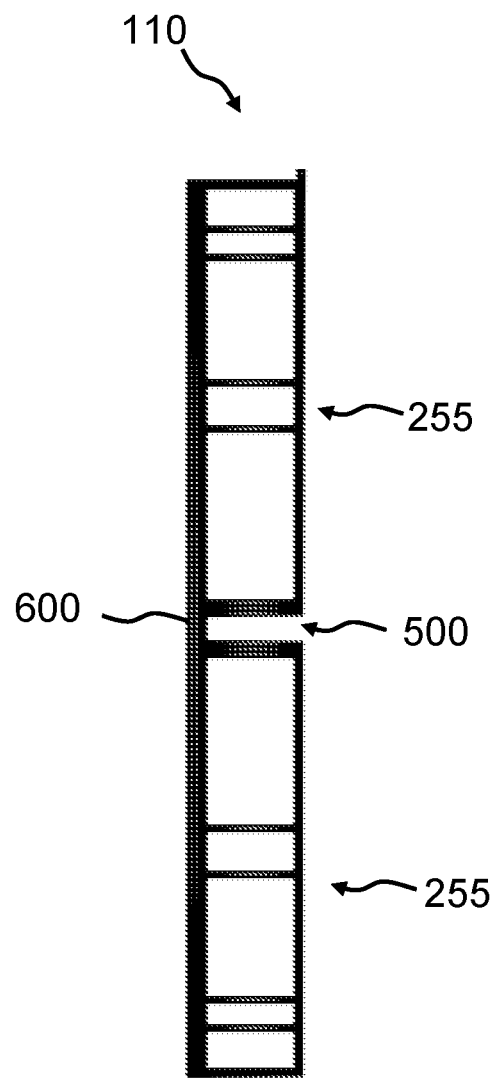
FIG. 9 a side cross section of an energy conversion device according to one embodiment.

FIG. 9 shows a side cross section of an energy conversion device according to one embodiment. This can be the energy conversion device 110 described with reference to FIGS. 6 to 8.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An energy conversion device for providing thermal energy and electric energy for a gas burner, comprising:
    an energy converter configured to provide thermal energy for a gas burner ring in which gas is burned, the energy converter having at least one thermoelectric element configured to convert a portion of the thermal energy into electric energy using a thermoelectric material;
    at least a first surface, a second surface, and a support element that is comprised of the thermoelectric material and that is arranged between the first surface and the second surface; and
    at least a further first surface, a further second surface, and an additional second surface,
    wherein the further first surface is arranged opposite from the first surface and, together with the first surface, forms a first circular-ring segment, and
    wherein the further second surface and the additional second surface are arranged opposite from the second surface and, together with the second surface, form a second circular-ring segment.

2. The energy conversion device according to claim 1, wherein the thermoelectric material comprises, at least in part, magnesium silicide and/or polybutylene terephthalate.

3. The energy conversion device according to claim 1, comprising a further support element comprised of the thermoelectric material, an additional support element comprised of the thermoelectric material, and a supplementary support element comprised of the thermoelectric material.

4. The energy conversion device according to claim 3, wherein the further support element is arranged between the first surface and the additional second surface, the additional support element is arranged between the further first surface and the second surface, and the supplementary support element is arranged between the further first surface and the further second surface.

5. The energy conversion device according to claim 1, wherein, when the energy conversion device is in an operational state, the first surface and/or the further first surface are arranged facing the gas burner ring, and
    wherein the second surface, the further second surface, and/or the additional second surface are arranged facing a gas supply of the gas burner.

6. The energy conversion device according to claim 3, wherein the support element and the additional support element are arranged on a first radius of a circular ring comprising the first circular-ring segment and the second circular-ring segment, and the additional support element and the supplementary support element are arranged on a second radius of the circular ring.

7. The energy conversion device according to claim 1, comprising a filler material arranged between the first circular-ring segment and the second circular-ring segment,
    wherein the filler material has a lower thermal conductivity than the thermoelectric material.

8. The energy conversion device according to claim 1, comprising at least one passage opening configured such that, when the energy conversion device is in an operational state, it allows air and/or gas to pass from a gas supply of the gas burner through the energy conversion device to the gas burner ring.

9. The energy conversion device according to claim 8, wherein the at least one thermoelectric element comprises two thermoelectric elements, the at least one passage opening comprises two passage openings, and each thermoelectric element has one of the two passage openings.

10. The energy conversion device according to claim 8, wherein the at least one passage opening is configured in the first circular-ring segment and/or in the second circular-ring segment and/or in a filler material.

11. The energy conversion device according to claim 1, wherein the at least one thermoelectric element comprises a plurality of thermoelectric elements that are arranged in a circle and that are electrically connected in series.

12. The energy conversion device according to claim 11, comprising at least one air supply conduit arranged between two of the thermoelectric elements.

13. The energy conversion device according to claim 12, wherein the at least one air supply conduit is oriented radially relative to the gas burner and/or to the thermoelectric elements that are arranged in a circle.

14. The energy conversion device according to claim 1, comprising a base disc and/or a cover disc,
    wherein the base disc is arranged on a bottom of the energy conversion device facing a gas supply of the gas burner when the energy conversion device is in an operational state, the cover disc being arranged on the top of the energy conversion device facing the gas burner ring when the energy conversion device is in the operational state, and
    wherein the base disc and/or the cover disc are made at least partially of steel.

15. A gas burner having at least one energy conversion device according to claim 1, which is arranged between a gas supply of the gas burner and the gas burner ring.

16. The gas burner according to claim 15, comprising an energy storage device configured to store electric energy that has been converted by the energy conversion device.

17. The gas burner according to claim 15, comprising at least one electronic device,
    wherein the energy conversion device is configured to supply the at least one electronic device with electric energy.

18. A household appliance having at least one gas burner ring, wherein the at least one gas burner ring has a gas burner according to claim 15.

19. The household appliance according to claim 18, wherein the household appliance comprises a gas cooktop or a gas stove.

20. An energy conversion device for providing thermal energy and electric energy for a gas burner, comprising:
    an energy converter configured to provide thermal energy for a gas burner ring in which gas is burned, the energy converter having at least one thermoelectric element configured to convert a portion of the thermal energy into electric energy using a thermoelectric material,
    wherein the at least one thermoelectric element comprises a plurality of thermoelectric elements that are arranged in a circle and that are electrically connected in series, and
    wherein at least one air supply conduit is arranged between two of the thermoelectric elements.

* * * * *